(12) United States Patent
Neubecker et al.

(10) Patent No.: US 10,578,676 B2
(45) Date of Patent: Mar. 3, 2020

(54) VEHICLE MONITORING OF MOBILE DEVICE STATE-OF-CHARGE

(71) Applicant: Ford Global Technologies, LLC, Dearborn, MI (US)

(72) Inventors: Cynthia M. Neubecker, Westland, MI (US); John Robert Van Wiemeersch, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/824,558

(22) Filed: Nov. 28, 2017

(65) Prior Publication Data

US 2019/0162792 A1 May 30, 2019

(51) Int. Cl.
*G01R 31/387* (2019.01)
*G06F 1/3215* (2019.01)
*H02J 7/00* (2006.01)

(52) U.S. Cl.
CPC ......... *G01R 31/387* (2019.01); *G06F 1/3215* (2013.01); *H02J 7/0047* (2013.01); *H02J 7/0052* (2013.01); *H02J 2007/005* (2013.01); *H02J 2007/0096* (2013.01)

(58) Field of Classification Search
CPC . G01R 31/3634; G01R 31/387; H02J 7/0047; H02J 7/0052; H02J 2007/005; H02J 2007/0096; G06F 1/3215
USPC ...................................................... 455/573
See application file for complete search history.

(56) References Cited

U.S. PATENT DOCUMENTS

| 5,959,724 | A  | 9/1999  | Izumi     |
|-----------|----|---------|-----------|
| 6,275,754 | B1 | 8/2001  | Shimizu   |
| 6,356,828 | B1 | 3/2002  | Shimizu   |
| 6,452,617 | B1 | 9/2002  | Bates     |
| 6,476,730 | B2 | 11/2002 | Kakinami  |
| 6,477,260 | B1 | 11/2002 | Shimomura |
| 6,657,555 | B2 | 12/2003 | Shimizu   |
| 6,683,539 | B2 | 1/2004  | Trajkovic |
| 6,724,322 | B2 | 4/2004  | Tang      |
| 6,744,364 | B2 | 6/2004  | Wathen    |

(Continued)

FOREIGN PATENT DOCUMENTS

| CN | 101929921 A | 12/2010 |
|----|-------------|---------|
| CN | 103818204 A | 5/2014  |

(Continued)

OTHER PUBLICATIONS

US 9,772,406 B2, 09/2017, Liu (withdrawn)
(Continued)

*Primary Examiner* — Eugene Yun
(74) *Attorney, Agent, or Firm* — Frank Lollo; Eversheds Sutherland (US) LLP

(57) ABSTRACT

Method and apparatus are disclosed for vehicle monitoring of mobile device state-of-charge. An example vehicle includes a communication node, a charging station, and a controller. The controller is to receive, via the communication node, a state-of-charge (SOC) of a mobile device and determine a predicted SOC at a destination based on the SOC, a rate-of-change of the SOC, and a travel time to the destination. The controller also is to emit, responsive to the predicted SOC being less than a threshold, an instruction to couple the mobile device to the charging station.

4 Claims, 5 Drawing Sheets

(56) References Cited

U.S. PATENT DOCUMENTS

| | | |
|---|---|---|
| 6,768,420 B2 | 7/2004 | McCarthy |
| 6,801,855 B1 | 10/2004 | Walters |
| 6,850,844 B1 | 1/2005 | Walters |
| 6,850,148 B2 | 2/2005 | Masudaya |
| 6,927,685 B2 | 8/2005 | Wathen |
| 6,997,048 B2 | 2/2006 | Komatsu |
| 7,042,332 B2 | 5/2006 | Takamura |
| 7,123,167 B2 | 10/2006 | Staniszewski |
| 7,307,655 B1 | 12/2007 | Okamoto |
| 7,663,508 B2 | 2/2010 | Teshima |
| 7,737,866 B2 | 6/2010 | Wu |
| 7,813,844 B2 | 10/2010 | Gensler |
| 7,825,828 B2 | 11/2010 | Watanabe |
| 7,834,778 B2 | 11/2010 | Browne |
| 7,847,709 B2 | 12/2010 | McCall |
| 7,850,078 B2 | 12/2010 | Christenson |
| 7,924,483 B2 | 4/2011 | Smith |
| 8,035,503 B2 | 10/2011 | Partin |
| 8,054,169 B2 | 11/2011 | Bettecken |
| 8,098,146 B2 | 1/2012 | Petrucelli |
| 8,126,450 B2 | 2/2012 | Howarter |
| 8,164,628 B2 | 4/2012 | Stein |
| 8,180,524 B2 | 5/2012 | Eguchi |
| 8,180,547 B2 | 5/2012 | Prasad |
| 8,224,313 B2 | 7/2012 | Howarter |
| 8,229,645 B2 | 7/2012 | Lee |
| 8,242,884 B2 | 8/2012 | Holcomb |
| 8,335,598 B2 | 12/2012 | Dickerhoof |
| 8,401,235 B2 | 3/2013 | Lee |
| 8,493,236 B2 | 7/2013 | Boehme |
| 8,538,408 B2 | 9/2013 | Howarter |
| 8,542,130 B2 | 9/2013 | Lavoie |
| 8,552,856 B2 | 10/2013 | McRae |
| 8,587,681 B2 | 11/2013 | Guidash |
| 8,594,616 B2 | 11/2013 | Gusikhin |
| 8,599,043 B2 | 12/2013 | Kadowaki |
| 8,618,945 B2 * | 12/2013 | Furuta ............... G01C 21/3697 340/539.3 |
| 8,645,015 B2 | 2/2014 | Oetiker |
| 8,655,551 B2 | 2/2014 | Danz |
| 8,692,773 B2 | 4/2014 | You |
| 8,706,350 B2 | 4/2014 | Talty |
| 8,725,315 B2 | 5/2014 | Talty |
| 8,742,947 B2 | 6/2014 | Nakazono |
| 8,744,684 B2 | 6/2014 | Hong |
| 8,780,257 B2 | 7/2014 | Gidon |
| 8,787,868 B2 | 7/2014 | Leblanc et al. |
| 8,825,262 B2 | 9/2014 | Lee |
| 8,933,778 B2 | 1/2015 | Birkel |
| 8,957,786 B2 | 2/2015 | Stempnik |
| 8,994,548 B2 | 3/2015 | Gaboury |
| 8,995,914 B2 | 3/2015 | Nishidai |
| 9,008,860 B2 | 4/2015 | Waldock |
| 9,014,920 B1 | 4/2015 | Torres |
| 9,078,200 B2 | 7/2015 | Wuergler |
| 9,086,879 B2 | 7/2015 | Gautama et al. |
| 9,141,503 B1 | 9/2015 | Chen |
| 9,147,065 B2 | 9/2015 | Lauer |
| 9,154,920 B2 | 10/2015 | O'Brien |
| 9,168,955 B2 | 10/2015 | Noh |
| 9,193,387 B2 | 11/2015 | Auer |
| 9,225,531 B2 | 12/2015 | Hachey |
| 9,230,439 B2 | 1/2016 | Boulay et al. |
| 9,233,710 B2 | 1/2016 | Lavoie |
| 9,273,966 B2 | 3/2016 | Bartels |
| 9,275,208 B2 | 3/2016 | Protopapas |
| 9,283,960 B1 | 3/2016 | Lavoie |
| 9,286,803 B2 | 3/2016 | Tippelhofer |
| 9,302,675 B2 | 4/2016 | Schilling |
| 9,318,022 B2 | 4/2016 | Barth |
| 9,379,567 B2 | 6/2016 | Kracker |
| 9,381,859 B2 | 7/2016 | Nagata |
| 9,429,657 B2 | 8/2016 | Sidhu |
| 9,429,947 B1 | 8/2016 | Wengreen |
| 9,454,251 B1 | 9/2016 | Guihot |
| 9,469,247 B2 | 10/2016 | Juneja |
| 9,493,187 B2 | 11/2016 | Pilutti |
| 9,506,774 B2 | 11/2016 | Shutko |
| 9,511,799 B2 | 12/2016 | Lavoie |
| 9,522,675 B1 | 12/2016 | You |
| 9,529,519 B2 | 12/2016 | Blumenberg |
| 9,557,741 B1 | 1/2017 | Elie |
| 9,563,990 B2 | 2/2017 | Khan |
| 9,595,145 B2 | 3/2017 | Avery |
| 9,598,051 B2 | 3/2017 | Okada |
| 9,606,241 B2 | 3/2017 | Varoglu |
| 9,616,923 B2 | 4/2017 | Lavoie |
| 9,637,117 B1 | 5/2017 | Gusikhin |
| 9,651,655 B2 | 5/2017 | Feldman |
| 9,656,690 B2 | 5/2017 | Shen |
| 9,666,040 B2 | 5/2017 | Flaherty |
| 9,688,306 B2 | 6/2017 | McClain |
| 9,701,280 B2 | 7/2017 | Schussmann |
| 9,712,977 B2 | 7/2017 | Tu |
| 9,715,816 B1 | 7/2017 | Adler |
| 9,725,069 B2 | 8/2017 | Krishnan |
| 9,731,714 B2 | 8/2017 | Kiriya |
| 9,731,764 B2 | 8/2017 | Baek |
| 9,754,173 B2 | 9/2017 | Kim |
| 9,809,218 B2 | 11/2017 | Elie |
| 9,811,085 B1 | 11/2017 | Hayes |
| 9,842,444 B2 | 12/2017 | Van Wiemeersch |
| 9,845,070 B2 | 12/2017 | Petel |
| 9,846,431 B2 | 12/2017 | Petel |
| 9,914,333 B2 | 3/2018 | Shank |
| 9,921,743 B2 | 3/2018 | Bryant |
| 9,946,255 B2 | 4/2018 | Matters |
| 9,959,763 B2 | 5/2018 | Miller |
| 9,971,130 B1 | 5/2018 | Lin |
| 9,975,504 B2 | 5/2018 | Dalke |
| 10,019,001 B2 | 7/2018 | Dang Van Nhan |
| 10,032,276 B1 | 7/2018 | Liu |
| 10,040,482 B1 | 8/2018 | Jung |
| 10,043,076 B1 | 8/2018 | Zhang |
| 10,131,347 B2 | 11/2018 | Kim |
| 10,192,113 B1 | 1/2019 | Liu |
| 10,246,055 B2 | 4/2019 | Farges |
| 10,268,341 B2 | 4/2019 | Kocienda |
| 2003/0060972 A1 | 3/2003 | Kakinami |
| 2003/0098792 A1 | 5/2003 | Edwards |
| 2003/0133027 A1 | 7/2003 | Itoh |
| 2005/0030156 A1 | 2/2005 | Alfonso |
| 2005/0068450 A1 | 3/2005 | Steinberg |
| 2005/0099275 A1 | 5/2005 | Kamdar |
| 2006/0010961 A1 | 1/2006 | Gibson |
| 2006/0227010 A1 | 10/2006 | Berstis |
| 2006/0235590 A1 | 10/2006 | Bolourchi |
| 2007/0230944 A1 | 10/2007 | Georgiev |
| 2008/0027591 A1 | 1/2008 | Lenser |
| 2008/0154464 A1 | 6/2008 | Sasajima |
| 2008/0154613 A1 | 6/2008 | Haulick |
| 2008/0238643 A1 | 10/2008 | Malen |
| 2008/0306683 A1 | 12/2008 | Ando |
| 2009/0096753 A1 | 4/2009 | Lim |
| 2009/0098907 A1 | 4/2009 | Huntzicker |
| 2009/0115639 A1 | 5/2009 | Proefke |
| 2009/0125181 A1 | 5/2009 | Luke |
| 2009/0125311 A1 | 5/2009 | Haulick |
| 2009/0128315 A1 | 5/2009 | Griesser |
| 2009/0146813 A1 | 6/2009 | Nuno |
| 2009/0174574 A1 | 7/2009 | Endo |
| 2009/0241031 A1 | 9/2009 | Gamaley |
| 2009/0289813 A1 | 11/2009 | Kwiecinski |
| 2009/0309970 A1 | 12/2009 | Ishii |
| 2009/0313095 A1 | 12/2009 | Hurpin |
| 2010/0025942 A1 | 2/2010 | Von Rehyer |
| 2010/0061564 A1 | 3/2010 | Clemow |
| 2010/0114471 A1 | 5/2010 | Sugiyama |
| 2010/0114488 A1 | 5/2010 | Khamharn |
| 2010/0136944 A1 | 6/2010 | Taylor |
| 2010/0152972 A1 | 6/2010 | Attard |
| 2010/0156672 A1 | 6/2010 | Yoo |
| 2010/0245277 A1 | 9/2010 | Nakao |
| 2010/0259420 A1 | 10/2010 | Von Rehyer |

(56) References Cited

U.S. PATENT DOCUMENTS

| | | |
|---|---|---|
| 2011/0071725 A1 | 3/2011 | Kleve |
| 2011/0082613 A1 | 4/2011 | Oetiker |
| 2011/0190972 A1 | 8/2011 | Timmons |
| 2011/0205088 A1 | 8/2011 | Baker |
| 2011/0253463 A1 | 10/2011 | Smith |
| 2011/0309922 A1 | 12/2011 | Ghabra |
| 2012/0007741 A1 | 1/2012 | Laffey |
| 2012/0072067 A1 | 3/2012 | Jecker |
| 2012/0083960 A1 | 4/2012 | Zhu |
| 2012/0173080 A1 | 7/2012 | Cluff |
| 2012/0176332 A1 | 7/2012 | Fujibayashi |
| 2012/0271500 A1 | 10/2012 | Tsimhoni |
| 2012/0303258 A1 | 11/2012 | Pampus |
| 2012/0323643 A1 | 12/2012 | Volz |
| 2012/0323700 A1 | 12/2012 | Aleksandrovich |
| 2013/0021171 A1 | 1/2013 | Hsu |
| 2013/0024202 A1 | 1/2013 | Harris |
| 2013/0043989 A1 | 2/2013 | Niemz |
| 2013/0073119 A1 | 3/2013 | Huger |
| 2013/0109342 A1 | 5/2013 | Welch |
| 2013/0110342 A1 | 5/2013 | Wuttke |
| 2013/0113936 A1 | 5/2013 | Cohen |
| 2013/0124061 A1 | 5/2013 | Khanafer |
| 2013/0145441 A1 | 6/2013 | Mujumdar |
| 2013/0211623 A1 | 8/2013 | Thompson |
| 2013/0231824 A1 | 9/2013 | Wilson |
| 2013/0289825 A1 | 10/2013 | Noh |
| 2013/0314502 A1 | 11/2013 | Urbach |
| 2013/0317944 A1 | 11/2013 | Huang |
| 2014/0052323 A1 | 2/2014 | Reichel |
| 2014/0095994 A1 | 4/2014 | Kim |
| 2014/0096051 A1 | 4/2014 | Boblett |
| 2014/0121930 A1 | 5/2014 | Allexi |
| 2014/0147032 A1 | 5/2014 | Yous |
| 2014/0156107 A1 | 6/2014 | Karasawa |
| 2014/0188339 A1 | 7/2014 | Moon |
| 2014/0222252 A1 | 8/2014 | Matters |
| 2014/0240502 A1 | 8/2014 | Strauss |
| 2014/0282931 A1 | 9/2014 | Protopapas |
| 2014/0297120 A1 | 10/2014 | Cotgrove |
| 2014/0300504 A1 | 10/2014 | Shaffer |
| 2014/0303839 A1 | 10/2014 | Filev |
| 2014/0320318 A1 | 10/2014 | Victor |
| 2014/0327736 A1 | 11/2014 | DeJohn |
| 2014/0350804 A1 | 11/2014 | Park |
| 2014/0350855 A1 | 11/2014 | Vishnuvajhala |
| 2014/0365108 A1 | 12/2014 | You |
| 2014/0365126 A1 | 12/2014 | Vulcano |
| 2015/0022468 A1 | 1/2015 | Cha |
| 2015/0039173 A1 | 2/2015 | Beaurepaire |
| 2015/0039224 A1 | 2/2015 | Tuukkanen |
| 2015/0048927 A1 | 2/2015 | Simmons |
| 2015/0066545 A1 | 3/2015 | Kotecha |
| 2015/0077522 A1 | 3/2015 | Suzuki |
| 2015/0088360 A1 | 3/2015 | Bonnet |
| 2015/0091741 A1 | 4/2015 | Stefik |
| 2015/0109116 A1 | 4/2015 | Grimm |
| 2015/0116079 A1 | 4/2015 | Mishra |
| 2015/0123818 A1 | 5/2015 | Sellschopp |
| 2015/0127208 A1 | 5/2015 | Jecker |
| 2015/0149265 A1 | 5/2015 | Huntzicker |
| 2015/0151789 A1 | 6/2015 | Lee |
| 2015/0153178 A1 | 6/2015 | Koo |
| 2015/0161890 A1 | 6/2015 | Huntzicker |
| 2015/0163649 A1 | 6/2015 | Chen |
| 2015/0197278 A1 | 7/2015 | Boos |
| 2015/0203111 A1 | 7/2015 | Bonnet |
| 2015/0203156 A1 | 7/2015 | Hafner |
| 2015/0210317 A1 | 7/2015 | Hafner |
| 2015/0217693 A1 | 8/2015 | Pliefke |
| 2015/0219464 A1 | 8/2015 | Beaurepaire |
| 2015/0220791 A1 | 8/2015 | Wu |
| 2015/0226146 A1 | 8/2015 | Elwart |
| 2015/0274016 A1 | 10/2015 | Kinoshita |
| 2015/0286340 A1 | 10/2015 | Send |
| 2015/0329110 A1 | 11/2015 | Stefan |
| 2015/0344028 A1 | 12/2015 | Gieseke |
| 2015/0346727 A1 | 12/2015 | Ramanujam |
| 2015/0360720 A1 | 12/2015 | Li |
| 2015/0365401 A1 | 12/2015 | Brown |
| 2015/0371541 A1 | 12/2015 | Korman |
| 2015/0375741 A1 | 12/2015 | Kiriya |
| 2015/0375742 A1 | 12/2015 | Gebert |
| 2016/0012653 A1 | 1/2016 | Soroka |
| 2016/0012726 A1 | 1/2016 | Wang |
| 2016/0018821 A1 | 1/2016 | Akita |
| 2016/0055749 A1 | 2/2016 | Nicoll |
| 2016/0153778 A1 | 2/2016 | Singh |
| 2016/0062354 A1 | 3/2016 | Li |
| 2016/0068158 A1 | 3/2016 | Elwart |
| 2016/0068187 A1 | 3/2016 | Hata |
| 2016/0075369 A1 | 3/2016 | Lavoie |
| 2016/0090055 A1 | 3/2016 | Breed |
| 2016/0107689 A1 | 4/2016 | Lee |
| 2016/0112846 A1 | 4/2016 | Siswick |
| 2016/0114726 A1 | 4/2016 | Nagata |
| 2016/0117926 A1 | 4/2016 | Akavaram |
| 2016/0127664 A1 | 5/2016 | Bruder |
| 2016/0139244 A1 | 5/2016 | Holtman |
| 2016/0144857 A1 | 5/2016 | Ohshima |
| 2016/0152263 A1 | 6/2016 | Singh |
| 2016/0170494 A1 | 6/2016 | Bonnet |
| 2016/0185389 A1 | 6/2016 | Ishijima |
| 2016/0189435 A1 | 6/2016 | Beaurepaire |
| 2016/0207528 A1 | 7/2016 | Stefan |
| 2016/0224025 A1 | 8/2016 | Petel |
| 2016/0229452 A1 | 8/2016 | Lavoie |
| 2016/0236680 A1 | 8/2016 | Lavoie |
| 2016/0249294 A1* | 8/2016 | Lee ............... H04W 52/0251 |
| 2016/0257304 A1 | 9/2016 | Lavoie |
| 2016/0272244 A1 | 9/2016 | Imai |
| 2016/0282442 A1 | 9/2016 | O'Mahony |
| 2016/0284217 A1 | 9/2016 | Lee |
| 2016/0288657 A1 | 10/2016 | Tokura |
| 2016/0300417 A1 | 10/2016 | Hatton |
| 2016/0304087 A1 | 10/2016 | Noh |
| 2016/0304088 A1 | 10/2016 | Barth |
| 2016/0349362 A1 | 10/2016 | Rohr |
| 2016/0321445 A1 | 11/2016 | Turgeman |
| 2016/0321926 A1 | 11/2016 | Mayer |
| 2016/0334797 A1 | 11/2016 | Ross |
| 2016/0347280 A1 | 12/2016 | Daman |
| 2016/0355125 A1 | 12/2016 | Herbert |
| 2016/0357354 A1 | 12/2016 | Chen |
| 2016/0358474 A1 | 12/2016 | Uppal |
| 2016/0368489 A1 | 12/2016 | Aich |
| 2016/0371607 A1 | 12/2016 | Rosen |
| 2016/0371691 A1 | 12/2016 | Kang |
| 2017/0001650 A1 | 1/2017 | Park |
| 2017/0008563 A1 | 1/2017 | Popken |
| 2017/0026198 A1 | 1/2017 | Ochiai |
| 2017/0028985 A1 | 2/2017 | Kiyokawa |
| 2017/0030722 A1 | 2/2017 | Kojo |
| 2017/0032593 A1 | 2/2017 | Patel |
| 2017/0072947 A1 | 3/2017 | Lavoie |
| 2017/0073004 A1 | 3/2017 | Shepard |
| 2017/0076603 A1 | 3/2017 | Bostick |
| 2017/0097504 A1 | 4/2017 | Takamatsu |
| 2017/0116790 A1 | 4/2017 | Kusens |
| 2017/0123423 A1 | 5/2017 | Sako |
| 2017/0129537 A1 | 5/2017 | Kim |
| 2017/0129538 A1 | 5/2017 | Stefan |
| 2017/0132482 A1 | 5/2017 | Kim |
| 2017/0144654 A1 | 5/2017 | Sham |
| 2017/0144656 A1 | 5/2017 | Kim |
| 2017/0147995 A1 | 5/2017 | Kalimi |
| 2017/0168479 A1 | 6/2017 | Dang |
| 2017/0192428 A1 | 7/2017 | Vogt |
| 2017/0200369 A1 | 7/2017 | Miller |
| 2017/0203763 A1 | 7/2017 | Yamada |
| 2017/0208438 A1 | 7/2017 | Dickow |
| 2017/0297385 A1 | 10/2017 | Kim |
| 2017/0297620 A1 | 10/2017 | Lavoie |
| 2017/0301241 A1 | 10/2017 | Urhahne |

(56) References Cited

U.S. PATENT DOCUMENTS

| | | |
|---|---|---|
| 2017/0308075 A1 | 10/2017 | Whitaker |
| 2017/0336788 A1 | 11/2017 | Iagnemma |
| 2017/0357317 A1 | 12/2017 | Chaudhri |
| 2017/0371514 A1 | 12/2017 | Cullin |
| 2018/0015878 A1 | 1/2018 | McNew |
| 2018/0024559 A1 | 1/2018 | Seo |
| 2018/0029591 A1 | 2/2018 | Lavoie |
| 2018/0029641 A1 | 2/2018 | Solar |
| 2018/0039264 A1 | 2/2018 | Messner |
| 2018/0043884 A1 | 2/2018 | Johnson |
| 2018/0056939 A1 | 3/2018 | Van Roermund |
| 2018/0056989 A1 | 3/2018 | Donald |
| 2018/0082588 A1 | 3/2018 | Hoffman, Jr. |
| 2018/0088330 A1 | 3/2018 | Giannuzzi |
| 2018/0093663 A1 | 4/2018 | Kim |
| 2018/0105165 A1 | 4/2018 | Alarcon |
| 2018/0105167 A1 | 4/2018 | Kim |
| 2018/0148094 A1 | 5/2018 | Mukaiyama |
| 2018/0174460 A1 | 6/2018 | Jung |
| 2018/0189971 A1 | 7/2018 | Hildreth |
| 2018/0194344 A1 | 7/2018 | Wang |
| 2018/0196963 A1 | 7/2018 | Bandiwdekar |
| 2018/0224863 A1 | 8/2018 | Fu |
| 2018/0236957 A1 | 8/2018 | Min |
| 2018/0284802 A1 | 10/2018 | Tsai |
| 2018/0286072 A1 | 10/2018 | Tsai |
| 2018/0339654 A1 | 11/2018 | Kim |
| 2018/0345851 A1 | 12/2018 | Lavoie |
| 2018/0364731 A1 | 12/2018 | Liu |
| 2019/0005445 A1 | 1/2019 | Bahrainwala |
| 2019/0042003 A1 | 2/2019 | Parazynski |
| 2019/0066503 A1 | 2/2019 | Li |
| 2019/0103027 A1 | 4/2019 | Wheeler |
| 2019/0137990 A1 | 5/2019 | Golgiri |

FOREIGN PATENT DOCUMENTS

| | | |
|---|---|---|
| CN | 104183153 A | 12/2014 |
| CN | 104485013 A | 4/2015 |
| CN | 104691544 A | 6/2015 |
| CN | 103049159 B | 7/2015 |
| CN | 105513412 A | 4/2016 |
| CN | 105588563 A | 5/2016 |
| CN | 105599703 A | 5/2016 |
| CN | 105774691 A | 7/2016 |
| CN | 106027749 A | 10/2016 |
| CN | 205719000 U | 11/2016 |
| CN | 106598630 A | 4/2017 |
| CN | 106782572 A | 5/2017 |
| CN | 106945662 A | 7/2017 |
| CN | 104290751 B | 1/2018 |
| DE | 3844340 A1 | 7/1990 |
| DE | 19817142 A1 | 10/1999 |
| DE | 19821163 A1 | 11/1999 |
| DE | 102005006966 A1 | 9/2005 |
| DE | 102006058213 A1 | 7/2008 |
| DE | 102009024083 A1 | 7/2010 |
| DE | 102009051055 A1 | 7/2010 |
| DE | 102012008858 A1 | 11/2012 |
| DE | 102009060169 A1 | 6/2013 |
| DE | 102011122421 A1 | 6/2013 |
| DE | 102011080148 A1 | 7/2013 |
| DE | 102012200725 A1 | 7/2013 |
| DE | 102013004214 A1 | 9/2013 |
| DE | 102010034129 B4 | 10/2013 |
| DE | 102012215218 A1 | 6/2014 |
| DE | 102012222972 A1 | 6/2014 |
| DE | 102013213064 A1 | 1/2015 |
| DE | 102014009077 A1 | 2/2015 |
| DE | 102013016342 A1 | 4/2015 |
| DE | 102013019771 A1 | 5/2015 |
| DE | 102013019904 A1 | 5/2015 |
| DE | 102014007915 A1 | 12/2015 |
| DE | 102014011802 A1 | 2/2016 |
| DE | 102014011864 A1 | 2/2016 |
| DE | 102014111570 A1 | 2/2016 |
| DE | 102014015655 A1 | 4/2016 |
| DE | 102014226458 A1 | 6/2016 |
| DE | 102015209976 A1 | 12/2016 |
| DE | 102015221224 A1 | 5/2017 |
| DE | 102016011916 A1 | 6/2017 |
| DE | 102016125282 A1 | 7/2017 |
| DE | 102016211021 A1 | 12/2017 |
| DE | 102016214433 A1 | 2/2018 |
| DE | 102016224529 A1 | 6/2018 |
| DE | 102016226008 A1 | 6/2018 |
| EP | 2289768 A2 | 3/2011 |
| EP | 2295281 A1 | 3/2011 |
| EP | 2653367 A1 | 10/2013 |
| EP | 2768718 B1 | 3/2016 |
| EP | 2620351 B1 | 6/2016 |
| EP | 2135788 B1 | 6/2017 |
| FR | 3021798 A1 | 12/2012 |
| FR | 3021798 A1 | 12/2015 |
| GB | 2344481 A | 6/2000 |
| GB | 2481324 A | 6/2011 |
| GB | 2491720 A | 12/2012 |
| GB | 2497836 A | 12/2012 |
| GB | 2517835 A | 3/2015 |
| GB | 2534471 A | 7/2016 |
| JP | 2000293797 A | 10/2000 |
| JP | 2004142543 A | 5/2004 |
| JP | 2004287884 A | 10/2004 |
| JP | 2005193742 A | 7/2005 |
| JP | 2009090850 A | 4/2009 |
| JP | 2014125196 A | 7/2014 |
| JP | 2014134082 A | 7/2014 |
| JP | 5586450 B2 | 9/2014 |
| JP | 5918683 B2 | 5/2016 |
| JP | 2016119032 A | 6/2016 |
| JP | 2018052188 A | 4/2018 |
| KR | 20090040024 A | 4/2009 |
| KR | 20100006714 A | 1/2010 |
| KR | 20130106005 A | 9/2013 |
| KR | 20160039460 A | 4/2016 |
| KR | 20160051993 A | 5/2016 |
| KR | 101641267 B | 7/2016 |
| WO | WO 2006/064544 A1 | 6/2006 |
| WO | WO 2008/055567 A1 | 5/2008 |
| WO | WO 2010/006981 A1 | 1/2010 |
| WO | WO 2011/141096 A1 | 11/2011 |
| WO | WO 2013/056959 A1 | 4/2013 |
| WO | WO 2013/123813 A1 | 8/2013 |
| WO | WO 2014/103492 A1 | 7/2014 |
| WO | WO 2015/068032 A1 | 5/2015 |
| WO | WO 2015/193058 A1 | 12/2015 |
| WO | WO 2016/046269 A1 | 3/2016 |
| WO | WO 2016/128200 A1 | 8/2016 |
| WO | WO 2016/134822 A1 | 9/2016 |
| WO | WO 2017/062448 A1 | 4/2017 |
| WO | WO 2017/073159 A1 | 5/2017 |
| WO | WO 2017/096307 A1 | 6/2017 |
| WO | WO 2017/096728 A1 | 6/2017 |
| WO | WO 2017/097942 A1 | 6/2017 |
| WO | WO 2017/112444 A1 | 6/2017 |
| WO | WO 2017/118510 A1 | 7/2017 |
| WO | WO 2017/125514 A1 | 7/2017 |

OTHER PUBLICATIONS

ChargeItSpot Locations, Find a Phone Charging Station Near You, retrieved at https://chargeitspot.com/locations/ on Nov. 28, 2017.

SafeCharge, Secure Cell Phone Charging Stations & Lockers, retrieved at https://www.thesafecharge.com on Nov. 28, 2017.

Alberto Broggi and Elena Cardarelli, Vehicle Detection for Autonomous Parking Using a Soft-Cascade ADA Boost Classifier, Jun. 8, 2014.

Al-Sherbaz, Ali et al., Hybridisation of GNSS with other wireless/sensors technologies on board smartphones to offer seamless outdoors-indoors positioning for LBS applications, Apr. 2016, 3 pages.

Automatically Into the Parking Space—https://www.mercedes-benz.com/en/mercedes-benz/next/automation/automatically-into-the-parking-space/; Oct. 27, 2014.

(56) References Cited

OTHER PUBLICATIONS

Bill Howard, Bosch's View of the Future Car: Truly Keyless Entry, Haptic Feedback, Smart Parking, Cybersecurity, Jan. 9, 2017, 8 Pages.
Core System Requirements Specification (SyRS), Jun. 30, 2011, Research and Innovative Technology Administration.
Daimler AG, Remote Parking Pilot, Mar. 2016 (3 Pages).
Jingbin Liu, IParking: An Intelligent Indoor Location-Based Smartphone Parking Service, Oct. 31, 2012, 15 pages.
Land Rover develops a smartphone remote control for its SUVs, James Vincent, Jun. 18, 2015.
Land Rover, Land Rover Remote Control via Iphone RC Range Rover Sport Showcase—Autogefühl, Retrieved from https://www.youtube.com/watch?v=4ZaaYNaEFio (at 43 seconds and 1 minute 42 seconds), Sep. 16, 2015.
Search Report dated Jan. 19, 2018 for GB Patent Application No. 1711988.4 (3 pages).
Search Report dated Jul. 11, 2017 for GB Patent Application No. GB 1700447.4 (3 pages).
Search Report dated May 21, 2018 for Great Britain Patent Application No. GB 1800277.4 (5 pages).
Search Report dated Nov. 22, 2018 for GB Patent Application No. GB 1809829.3 (6 pages).
Search Report dated Nov. 27, 2018 for GB Patent Application No. GB 1809112.4 (3 pages).
Search Report dated Nov. 28, 2017, for GB Patent Application No. GB 1710916.6 (4 Pages).
Search Report dated Nov. 28, 2018 for GB Patent Application No. GB 1809842.6 (5 pages).
Search Report dated Oct. 10, 2018 for GB Patent Application No. 1806499.8 (4 pages).
Tesla Model S Owner's Manual v2018.44. Oct. 29, 2018.

\* cited by examiner

VEHICLE MONITORING OF MOBILE DEVICE STATE-OF-CHARGE

TECHNICAL FIELD

The present disclosure generally relates to vehicle monitoring and, more specifically, to vehicle monitoring of mobile device state-of-charge.

BACKGROUND

Recently, vehicles include systems that incorporate mobile devices for control features of vehicle functions. Some vehicles include a passive entry system that unlocks and/or opens door(s) of the vehicle upon detecting that a mobile device of a user is near the vehicle. Some vehicles include a passive start system that enables ignition of a vehicle engine upon detecting that a mobile device of a user is within a cabin of the vehicle. Some vehicles include a remote park-assist system in which a mobile device is used to initiate and/or control autonomous and/or semi-autonomous parking of the vehicle in a parking spot while a user of the mobile device is located outside of a cabin of the vehicle.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown for vehicle monitoring of mobile device state-of-charge. An example disclosed vehicle includes a communication node, a charging station, and a controller. The controller is to receive, via the communication node, a state-of-charge (SOC) of a mobile device and determine a predicted SOC at a destination based on the SOC, a rate-of-change of the SOC, and a travel time to the destination. The controller also is to emit, responsive to the predicted SOC being less than a threshold, an instruction to couple the mobile device to the charging station.

In some examples, the communication node is a wireless personal area network module. In some examples, the controller determines the rate-of-change of the mobile device by monitoring the SOC over a period of time. In some examples, the controller receives the rate-of-change from the mobile device via the communication node.

Some examples further include a navigation system that receives the destination from a user and determines the travel time between the destination and a current location. Some such examples further include at least one of a GPS receiver and a GNSS receiver to identify the current vehicle location.

Some examples further include an infotainment head unit that includes at least one of a cluster output, a display, and a speaker. The controller emits the instruction via the infotainment head unit.

In some examples, the controller determines the predicted SOC responsive to identifying that the mobile device is located within a vehicle cabin. In some such examples, the communication node identifies whether the mobile device is located within the vehicle cabin via at least one of a received signal strength indicator, a time-of-flight, and an angle-of-arrival.

In some examples, the controller determines the predicted SOC responsive to identifying that the mobile device is utilized for at least one of passive entry, passive start, and remote park-assist. In some examples, the controller further emits the instruction responsive to determining that the SOC is less than a second threshold. In some examples, the controller further emits the instruction responsive to determining that the rate-of-change is greater than a third threshold.

An example disclosed method includes receiving a state of charge (SOC) of a mobile device via a communication node of a vehicle and determining, via a processor, a predicted SOC at a destination of the vehicle based on the SOC, a rate of change of the SOC, and a travel time to the destination. The example disclosed method also includes emitting an instruction to couple the mobile device to the charging station responsive to the predicted SOC being less than a threshold.

Some examples further include emitting the instruction responsive to determining, via the processor, that the SOC is less than a second threshold.

An example disclosed system includes a mobile device that includes a sensor to measure a state of charge (SOC) and a communication module to send the SOC. The example disclosed system also includes a vehicle that includes a communication node to receive the SOC, a charging station, and a controller. The controller is to determine a predicted SOC based on the SOC, a rate-of-change, and a travel time to a destination and instruct to utilize the charging station when the predicted SOC is less than a threshold.

In some examples, the mobile device further includes a navigation system that receives the destination from a user and determines the travel time between the destination and the current location.

In some examples, the mobile device includes a processor that identifies when the mobile device is communicatively decoupled from the vehicle. In some such examples, when the mobile device and the vehicle are communicatively decoupled, the processor emits at least one of an audio alert, a visual alert, and a haptic alert in response to determining that the SOC is less than a second threshold. In some such examples, when the mobile device and the vehicle are communicatively decoupled, the processor is to determine whether the SOC is less than a second threshold. The processor also is to identify, in response to determining that the SOC is less than the second threshold, an open public charging station from an external network and provide directions to the open public charging station. In some such examples, when the mobile device and the vehicle are communicatively decoupled, the processor turns off the mobile device in response to determining that the SOC is less than a third threshold.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1A:
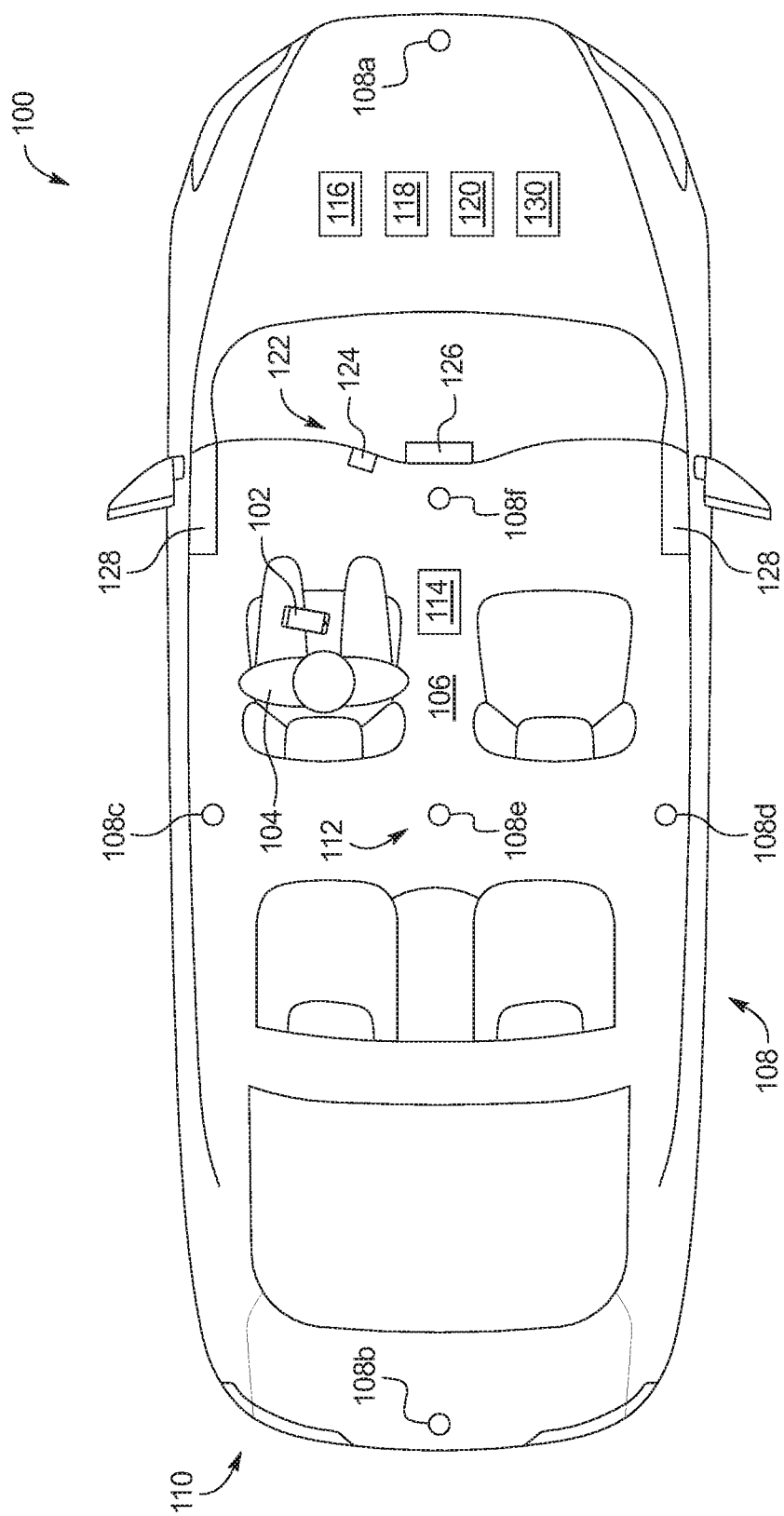
FIG. 1A illustrates an example mobile device of a user within an example vehicle in accordance with the teachings herein.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Vehicles oftentimes include systems that incorporate mobile devices for control features of vehicle functions. Some vehicles include a passive entry system that unlocks and/or opens door(s) of the vehicle upon detecting that a mobile device of a user is near the vehicle. Some vehicles include a passive start system that enables ignition of a vehicle engine upon detecting that a mobile device of a user is within a cabin of the vehicle. Some vehicles include a remote park-assist system in which a mobile device is used to initiate and/or control autonomous and/or semi-autonomous parking of the vehicle in a parking spot while a user of the mobile device is located outside of a cabin of the vehicle.

Mobile devices have been incorporated into the performance of such commonly-performed vehicle functions over time, at least in part, because people use their mobile devices (e.g., smart phones, wearables, smart watches, tablets, etc.) today at ever-increasing frequencies. While the utilization of mobile devices to access, start, and park a vehicle has made it easier for people to operate their vehicles, the convenience of the mobile device potentially may present challenges to the performance of such vehicle functions. For instance, consistent use of mobile device throughout the day potentially may result in a user unknowingly draining his or her battery to be fully discharged. If the battery is fully discharged, the vehicle system is unable to use the mobile device for accessing, starting, and/or parking the vehicle. Further, some mobile device disable power-consuming functions, such as Bluetooth® or Wi-Fi, when a state-of-charge of the mobile device battery is below a lower threshold to preserve the state-of-charge battery for other mobile device functions (e.g., phone calls). In such instances, the user may be unable to utilize the mobile device for passive start, passive entry, and/or remote park-assist if the user is unaware that the mobile device has disabled the power-consuming communication functions (e.g., Bluetooth®, Wi-Fi, NFC) as a result of the state-of-charge of the mobile device battery being below the lower threshold. Example methods and apparatus disclosed herein monitor a state-of-charge of a mobile device battery over time and perform measures to facilitate recharging of the battery to prevent the battery from being discharged below a threshold state-of-charge level when passive entry, passive start, and/or remote park-assist functions is to be performed.

Examples disclosed herein include a system for monitoring a mobile device that is utilized for remote park-assist and/or as a phone-as-a-key for passive entry and/or passive start. As used herein, "remote parking," "vehicle remote park-assist," "remote park-assist," and "RePA" refer to a vehicle controlling motive functions of the vehicle without direct steering or velocity input from a driver to autonomously park the vehicle into a parking spot while the driver is located outside of the vehicle. For example, a remote park assist-system of an autonomy unit controls the motive functions of the vehicle upon initiation from a driver to remotely park the vehicle into a parking spot.

As used herein, a "phone-as-a-key" refers to a mobile device (e.g., a smart phone, a wearable, a smart watch, a tablet, etc.) that includes hardware and/or software to function as a key fob. As used herein, a "key fob" refers to an electronic device that wirelessly communicates with a vehicle to unlock and/or lock one or more vehicle doors, open and/or close one or more of the vehicle doors, activate an engine of the vehicle, and/or initiate other function(s) of the vehicle. A user of a vehicle may utilize a mobile device functioning as a phone-as-a-key and/or a key fob for passive entry and/or passive start.

As used herein, "passive entry" refers to a system of a vehicle that unlock(s) and/or open(s) one or more doors of the vehicle upon detecting that a key fob and/or a phone-as-a-key is proximate to and/or approaching the vehicle. Some passive entry systems unlock and/or open a door in response to detecting a key fob and/or a phone-as-a-key. Further, some passive entry systems trigger a door for opening in response to detecting a key fob and/or a phone-as-a-key such that the door unlocks upon detecting that a user has touched a handle of the door. As used herein, "passive start" refers to a system of a vehicle that activates ignition of an engine of the vehicle upon detecting that a key fob and/or a phone-as-a-key is within a cabin of the vehicle. Some passive start systems activate ignition of the engine in response to detecting a key fob and/or a phone-as-a-key. Further, some passive start systems trigger an engine for ignition in response to detecting a key fob and/or a phone-as-a-key such that the ignition of the engine is started when an ignition switch within the cabin of the vehicle is pressed and/or rotated.

The system of examples disclosed herein measures the state-of-charge and a rate-of-change (ROC) of the mobile device and determines a predicted state-of-charge of the battery for an end of a vehicle trip. As used herein, a "charge level," a "state-of-charge," and an "SOC" refer to a measurement of an amount of energy stored within a battery. As used herein, a "rate-of-change" and a "ROC" of a battery refer to a rate at which a state-of-charge changes over a period of time.

The system of examples disclosed herein determines the predicted state-of-charge of the mobile device based on the current state-of-charge, the rate-of-change, and/or navigation information of a navigation system of the vehicle and/or the mobile device. For example, the system continuously monitors usage demands (i.e. movies and music streaming, calls, hotspot. etc.) of a state-of-charge of a battery of the mobile device and monitors for rate-of-change updates to update a predicated state-of-charge. The system may emit an in-vehicle alert to instruct a user to charge the mobile device upon detecting that (i) predicted state-of-charge is below a first charge threshold, (ii) the current state-of-charge is below a second charge threshold, or (iii) the rate-of-change is above a rate threshold. Further, upon detecting that the user has exited the vehicle with the mobile device, the system may provide (i) an alert via an output device of the mobile device, (ii) directions to publically-available charging station(s), and/or (iii) instructions to turn off the mobile device in response to determining that the current state-of-charge of the mobile device is below a charge threshold.

Figure 1B:
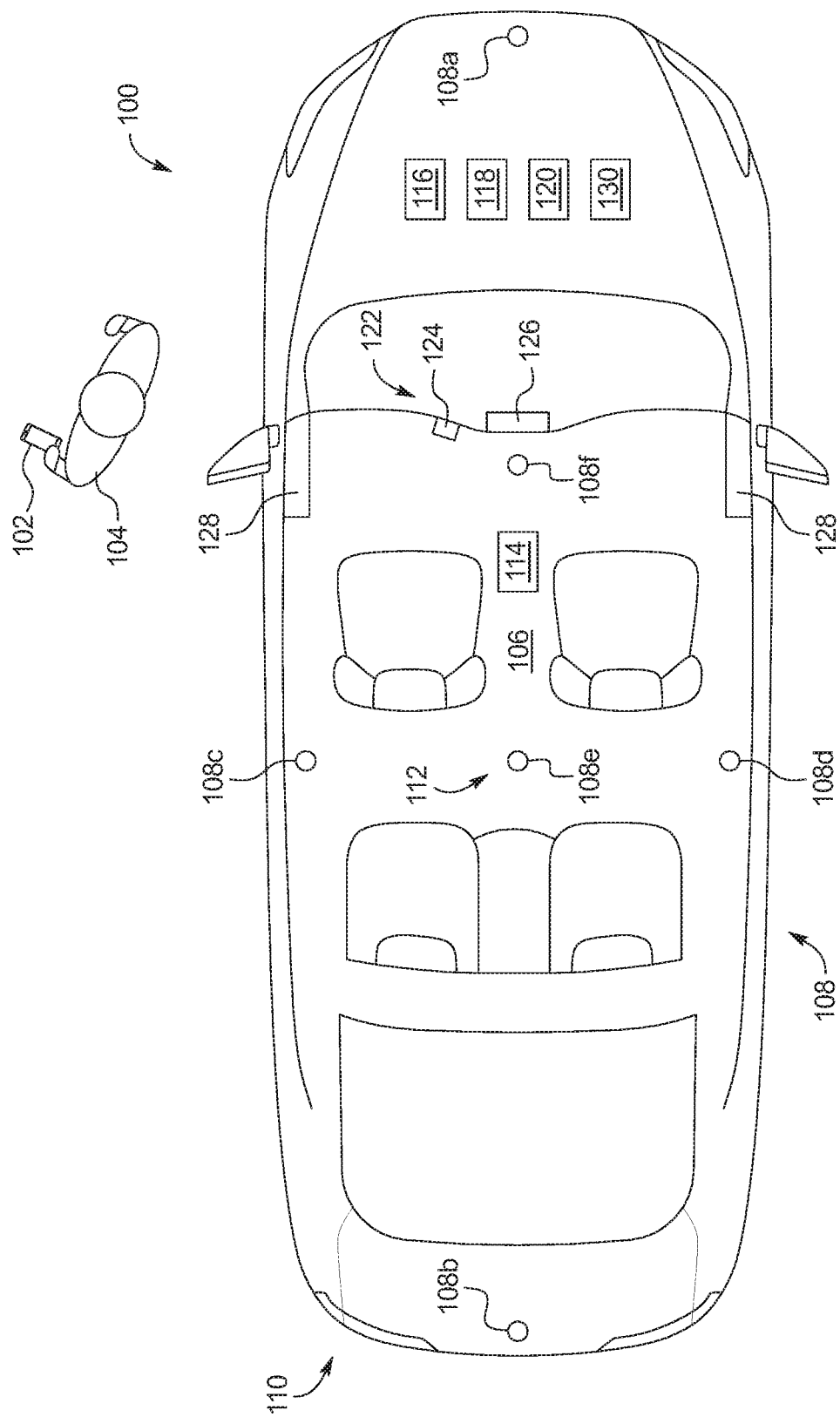
FIG. 1B the mobile device outside of the vehicle of FIG. 1A.

Turning to the figures, FIGS. 1A-1B illustrate an example vehicle 100 in accordance with the teachings herein. More specifically, FIG. 1A depicts the vehicle 100 when a mobile device 102 (e.g., a smart phone, a wearable, a smart watch, a tablet, etc.) of a user 104 is located within a cabin 106 of the vehicle 100, and FIG. 1B depicts the vehicle 100 when the mobile device 102 of the user 104 is located outside of the cabin 106.

The vehicle 100 of the illustrated example may be a standard gasoline powered vehicle, a hybrid vehicle, an electric vehicle, a fuel cell vehicle, and/or any other mobility implement type of vehicle. The vehicle 100 includes parts related to mobility, such as a powertrain with an engine, a transmission, a suspension, a driveshaft, and/or wheels, etc. The vehicle 100 may be non-autonomous, semi-autonomous (e.g., some routine motive functions controlled by the vehicle 100), or autonomous (e.g., motive functions are controlled by the vehicle 100 without direct driver input).

As illustrated in FIGS. 1A-1B, the vehicle 100 includes communication nodes 108. In the illustrated example, each of the communication nodes 108 is configured to communicatively couple to the mobile device 102 of the user 104 (e.g., an occupant of the vehicle 100). Each of the communication nodes 108 includes hardware and firmware to establish a wireless connection with a key fob and/or a mobile device (e.g., the mobile device 102). For example, the communication nodes 108 are wireless personal area network (WPAN) modules that wirelessly communicate with key fob(s) and/or mobile device(s) (e.g., the mobile device 102) via short-range wireless communication protocol(s). In some examples, the communication nodes 108 implement the Bluetooth® and/or Bluetooth® Low Energy (BLE®) protocols. The Bluetooth® and BLE® protocols are set forth in Volume 6 of the Bluetooth® Specification 4.0 (and subsequent revisions) maintained by the Bluetooth® Special Interest Group. Additionally or alternatively, the communication nodes 108 are configured to wirelessly communicate via Wi-Fi®, Near Field Communication (NFC), UWB (Ultra-Wide Band), and/or any other short-range and/or local wireless communication protocol (e.g., IEEE 802.11 a/b/g/n/ac/p) that enables each of the communication nodes 108 to communicatively couple to the mobile device 102.

The communication nodes 108 of the illustrated example include a communication node 108a (e.g., a first communication node), a communication node 108b (e.g., a second communication node), a communication node 108c (e.g., a third communication node), a communication node 108d (e.g., a fourth communication node), a communication node 108e (e.g., a fifth communication node), and a communication node 108f (e.g., a sixth communication node). The communication nodes 108a, 108b, 108c, 108d are exterior nodes 110 of the communication nodes 108. The exterior nodes 110 are positioned and oriented to communicatively couple to and/or monitor communication of the mobile device 102 and/or a key fob when the mobile device 102 and/or the key fob is located outside of and/or within the cabin 106 of the vehicle 100. For example, each of the communication nodes 108a, 108b, 108c, 108d is located near an exterior of the vehicle 100 and oriented in a direction away from the cabin 106 to communicatively couple to the mobile device 102 when the mobile device 102 is outside of the cabin 106 of the vehicle 100. The communication nodes 108e, 108f are interior nodes 112 of the communication nodes 108. The interior nodes 112 are positioned and oriented to communicatively couple to and/or monitor communication of the mobile device 102 and/or a key fob when the mobile device 102 and/or the key fob is located within and/or outside of the cabin 106 of the vehicle 100. For example, the communication node 108e is located near and oriented toward a front portion of the cabin 106 to communicatively couple to and/or monitor communication of the mobile device 102 and/or a key fob when the mobile device 102 and/or the key fob is located within the front portion of the cabin 106. Further, the communication node 108f is located near and oriented toward a rear portion of the cabin 106 to communicatively couple to and/or monitor communication of the mobile device 102 and/or a key fob when the mobile device 102 and/or the key fob is located within the rear portion of the cabin 106.

The vehicle 100 also includes a charging station 114 that is located within the cabin 106. In other examples, the charging station 114 is located along an exterior of the vehicle 100. The charging station 114 may include a wired charger and/or a wireless charger. For example, a wired charger of the charging station 114 includes a socket (e.g., a 12 Volt socket), a plug that is configured to be inserted into the socket, and/or a wire that extends from the socket and/or the plug and is configured to couple to the mobile device 102 to recharge a battery of the mobile device 102 (e.g., a battery 212 of FIG. 2). A wireless charger of the charging station 114 includes, for example, a charging coil that induces a magnetic field. When the mobile device 102 is placed on and/or near the charging station 114, the magnetic field induced by the charging coil generates current within another charging coil of the mobile device 102 to recharge the battery of the mobile device 102.

Further, the vehicle 100 of the illustrated example includes a vehicle speed sensor 116, a global positioning system (GPS) receiver 118, and a navigation system 120. For example, the vehicle speed sensor 116 detects a speed at which the vehicle 100 is traveling. In some examples, by measuring the speed of the vehicle 100 over a period of time, the vehicle 100 detects an acceleration of the vehicle 100. Additionally, the GPS receiver 118 receives a signal from a global positioning system to identify a current location of the vehicle 100. Additionally or alternatively, the vehicle 100 includes a global navigation satellite system (GNSS) receiver to receives a signal from a global navigation satellite system to identify a current location of the vehicle 100. The navigation system 120 is an electronic system that facilitates the user 104 in navigating while the user 104 and/or another user operates the vehicle 100. For example, the navigation system 120 presents map(s), provides direction(s), and/or identifies traffic condition(s) and/or obstacle(s) to facilitate the user 104 in navigating from a current location of the vehicle 100 to a target destination.

As illustrated in FIG. 1, the vehicle 100 also includes an infotainment head unit 122 that provides an interface between the vehicle 100 and the user 104. The infotainment head unit 122 includes digital and/or analog interfaces (e.g., input devices and output devices) to receive input from and display information for the user 104. The input devices include, for example, a control knob, an instrument panel, a digital camera for image capture and/or visual command recognition, a touchscreen, an audio input device (e.g., cabin microphone), buttons, or a touchpad. The output devices may include a cluster output 124 (e.g., a dial, a lighting device), an actuator, a display 126 (e.g., a heads-up display, a center console display such as liquid crystal display (LCD), an organic light emitting diode (OLED) display, a flat panel display, a solid state display, etc.), and/or speakers 128. In some examples, the display 126 is a touchscreen that is configured to function as input device and an output device. Further, in the illustrated example, the infotainment head unit 122 includes hardware (e.g., a processor or controller, memory, storage, etc.) and software (e.g., an operating system, etc.) for an infotainment system (such as SYNC® and MyFord Touch® by Ford®, etc.). Additionally, the infotainment head unit 122 displays the infotainment system, the navigation system 120, and/or other user interface system(s) on, for example, the display 126.

The vehicle 100 also includes a charge controller 130 that monitors the mobile device 102 and provides instructions to the user 104 to recharge the mobile device 102 to prevent a battery (e.g., a battery 212 of FIG. 2) from being fully discharged when the mobile device 102 is to be utilized for passive entry, passive start, remote park-assist, and/or other vehicle functions of the vehicle 100. For example, charge controller 130 monitors the battery of the mobile device 102 (e.g., collects a state-of-charge, identifies a rate-of-change, determines a predicted state-of-change at a destination) in response to identifying that the mobile device 102 is configured to be utilized for passive entry, passive start, and/or remote park-assist of the vehicle 100.

In operation, the charge controller 130 determines whether the mobile device 102 is located within the cabin 106 of the vehicle 100. The charge controller 130 determines whether the mobile device 102 is located within the cabin 106 via received signal strength indicators, GPS, time-of-flight, angle-of-arrival, etc. For example, the charge controller 130 determines that the mobile device 102 is located within the cabin 106 if the received signal strength indicators of communication between the mobile device 102 and the interior nodes 112 is greater than the received signal strength indicators of communication between the mobile device 102 and the exterior nodes 110. In such examples, the charge controller 130 determines that the mobile device 102 is located outside of the vehicle 100 if the received signal strength indicators of communication between the mobile device 102 and the exterior nodes 110 is greater than the received signal strength indicators of communication between the mobile device 102 and the interior nodes 112. If the mobile device 102 is within the cabin 106 of the vehicle 100, the charge controller 130 determines whether to instruct the user 104 to couple the mobile device 102 to the charging station 114 of the vehicle 100.

To monitor the mobile device 102, the charge controller 130 receives a current state-of-charge of the battery of the mobile device 102 via one or more of the communication nodes 108 of the vehicle 100. The charge controller 130 also is configured to identify a rate-of-change of the state-of-charge of the mobile device 102. In some examples, the charge controller 130 determines the rate-of-change by monitoring the state-of-charge of the battery 212 over a period of time. In other examples, the charge controller 130 receives the rate-of-change from the mobile device 102 via one or more of the communication nodes 108.

Further, in some examples, the charge controller 130 identifies a travel time to a target destination of the vehicle 100. For example, the charge controller 130 receives the travel time that is determined by the navigation system 120 of the vehicle 100. The navigation system 120 determines the travel time to the target destination based upon a current location of the vehicle 100 and a location of the target destination. For example, the navigation system collects the current location of the vehicle 100 from the GPS receiver 118 and/or the GNSS receiver and receives the target destination from the user 104 via an input device of the infotainment head unit 122 and/or the mobile device 102 in communication with the vehicle 100.

Subsequently, the charge controller 130 determines a predicted state-of-charge of the battery of the mobile device 102 for when the vehicle 100 arrives at the target destination. For example, the charge controller 130 determines the predicted state-of-charge of the mobile device 102 based upon the current state-of-charge of the mobile device 102, the rate-of-change of the mobile device 102, and/or the travel time to the target destination as predicted by the navigation system 120.

Further, the charge controller 130 of the illustrated example determines whether to emit an instruction to the user 104 to couple the mobile device 102 to the charging station 114 by comparing the predicted state-of-charge, the current state-of-charge, and/or the rate-of-change to threshold(s) associated with low battery levels. The charge controller 130 is configured to emit the instruction to the user 104 via the cluster output 124, the display 126, the speakers 128, and/or any other output device of the infotainment head unit 122. Further, in some examples, the charge controller 130 is configured to send a signal to the mobile device 102 to cause the mobile device 102 to emit the instruction (e.g., a visual instruction, an audio instruction, a haptic instruction) to the user 104 via the mobile device 102.

For example, the charge controller 130 emits an instruction to couple the mobile device 102 to the charging station 114 in response to determining that the predicted state-of-charge and/or the current state-of-charge is less than charge threshold. In some examples, the predicted state-of-charge and the current state-of-charge are compared to the same charge threshold (e.g., 40% of a full charge level). In other examples, the predicted state-of-charge the current state-of-charge are compared to different charge thresholds. For example, the charge controller 130 emits an instruction to couple the mobile device 102 to the charging station 114 in response to determining that the predicted state-of-charge is less than a first charge threshold (e.g., 60% of a full charge level) and/or in response to determining that the current state-of-charge is less than a second charge threshold (e.g., 40% of a full charge level). Additionally or alternatively, the charge controller 130 emits an instruction for the user 104 to couple the mobile device 102 to the charging station 114 in response to determining that the rate-of-change of the battery of the mobile device 102 is greater than a rate threshold (e.g., a state-of-charge decrease of 15% per hour). That is, the charge controller 130 emits an instruction in response to detecting that the state-of-charge is decreasing at a rate greater than a predetermined threshold.

Figure 2:
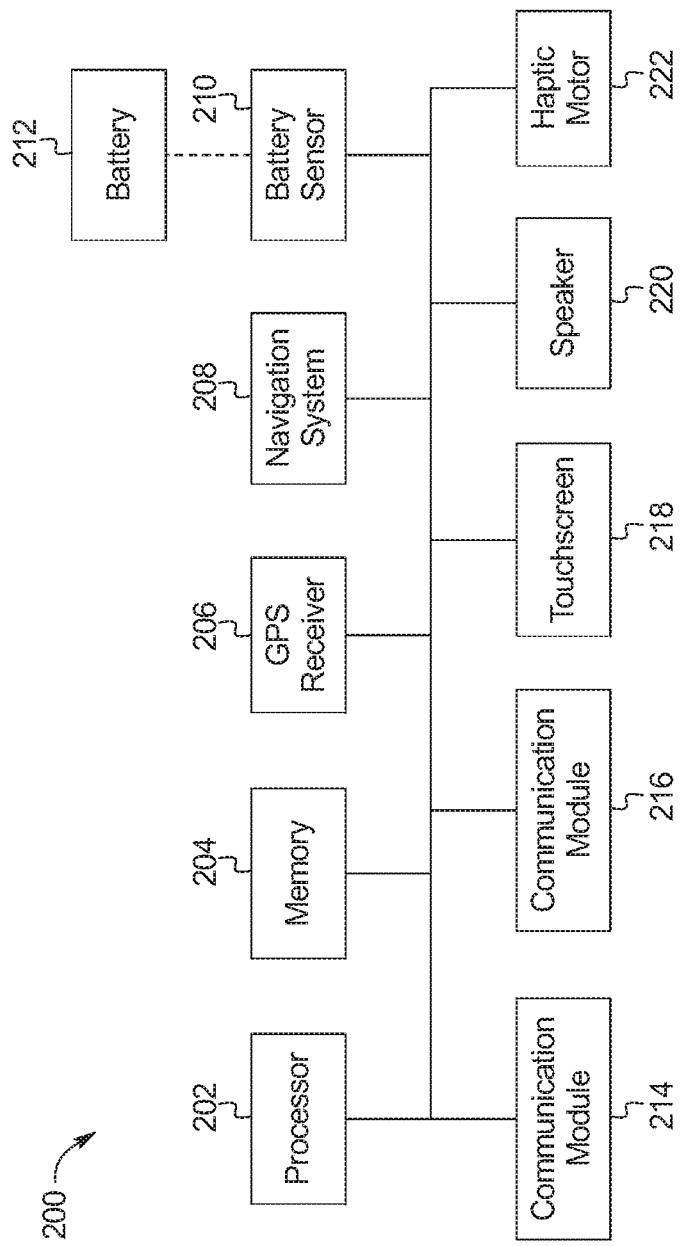
FIG. 2 is a block diagram of electronic components of the mobile device of FIGS. 1A-1B.

FIG. 2 is a block diagram of electronic components 200 of the mobile device 102. As illustrated in FIG. 2, the electronic components 200 include a processor 202, memory 204, a GPS receiver 206, a navigation system 208, a battery sensor 210 that monitors a battery 212, a communication module 214, a communication module 216, a touchscreen 218, a speaker 220, and a haptic motor 222.

The processor 202 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). In some examples, the processor 202 is structured to include the charge controller 130. The memory 204 may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc). In some examples, the memory 204 includes multiple kinds of memory, particularly volatile memory and non-volatile memory.

The memory 204 is computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory 204, the computer readable medium, and/or within the processor 202 during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

The GPS receiver 206 receives a signal from a global positioning system to identify a current location of the mobile device 102. Additionally, the navigation system 208 is an electronic system of the mobile device 102 that facilitates the user 104 in navigating while walking, traveling via the vehicle 100 and/or another vehicle, etc. For example, the navigation system 208 presents map(s), provides direction(s), and/or identifies traffic condition(s) and/or obstacle(s) to facilitate the user 104 in navigating from a current location of the mobile device 102 to a target destination.

Further, the battery sensor 210 of the illustrated example monitors the battery 212 of the mobile device 102. For example, the battery sensor 210 detects the state-of-charge of the battery 212. In some examples, the battery sensor 210 detects the rate-of-change of the battery 212 by measuring the state-of-charge of the battery 212 over a period of time.

The communication module 214 is configured to communicatively couple the mobile device 102 to the vehicle 100. The communication module 214 includes hardware and firmware to establish a wireless connection with the vehicle 100. For example, the communication module 214 is a wireless personal area network (WPAN) module that wirelessly communicates with the vehicle 100 via short-range wireless communication protocol(s). In some examples, the communication module 214 implements the Bluetooth® and/or Bluetooth® Low Energy (BLE) protocols. The Bluetooth® and BLE protocols are set forth in Volume 6 of the Bluetooth® Specification 4.0 (and subsequent revisions) maintained by the Bluetooth® Special Interest Group. Additionally or alternatively, the communication module 214 is configured to wirelessly communicate via Wi-Fi®, Near Field Communication (NFC), UWB (Ultra-Wide Band), and/or any other short-range and/or local wireless communication protocol (e.g., IEEE 802.11 a/b/g/n/ac/p) that enables the communication module 214 to communicatively couple to the vehicle 100.

The communication module 216 includes wired or wireless network interfaces to enable communication with external networks. The communication module 216 also includes hardware (e.g., processors, memory, storage, antenna, etc.) and software to control the wired or wireless network interfaces. In the illustrated example, the communication module 216 includes one or more communication controllers for cellular networks (e.g., Global System for Mobile Communications (GSM), Universal Mobile Telecommunications System (UMTS), Long Term Evolution (LTE), Code Division Multiple Access (CDMA)) and/or other standards-based networks (e.g., WiMAX (IEEE 802.16m); Near Field Communication (NFC), local area wireless network (including IEEE 802.11 a/b/g/n/ac/p or others), Wireless Gigabit (IEEE 802.11ad), etc.). The external network(s) may be a public network, such as the Internet; a private network, such as an intranet; or combinations thereof, and may utilize a variety of networking protocols now available or later developed including, but not limited to, TCP/IP-based networking protocols.

The electronic components 200 of the illustrated example also include the touchscreen 218, the speaker 220, and the haptic motor 222 that provide an interface between the user 104 and the mobile device 102. For example, the touchscreen 218 is a resistive touchscreen, a capacitive touchscreen, and/or any other type of touchscreen that displays output information to and tactilely receives input information from the user 104 of the mobile device 102. Additionally, the speaker 220 emits audio to the user 104 for informational and/or entertainment purposes. The haptic motor 222 is a motor that causes the mobile device 102 to vibrate, for example, upon receiving a signal from the processor 202 to do so. Further, the mobile device 102 may include other input device(s) (e.g., buttons, knobs, microphones, etc.) and/or output devices (e.g., LEDs, etc.) to receive input information from and/or provide output information to the user 104 of the mobile device 102.

In operation, the battery sensor 210 measures (e.g., continuously, periodically) a state-of-charge of the battery 212 of the mobile device 102. Further, the processor 202 determines whether the communication module 214 is communicatively coupled to one or more of the communication nodes 108 of the vehicle 100. If the processor 202 determines that the mobile device 102 is communicatively coupled to the vehicle 100, the processor 202 sends, via the communication module 214, the state-of-charge of the battery 212 to the vehicle 100.

Further, in some examples, the processor 202 sends (e.g., continuously, periodically) a rate-of-change of the battery 212, a current location, a target destination, and/or a travel time to the vehicle 100 via the communication module 214 if the mobile device 102 is communicatively coupled to the vehicle 100. For example, the processor 202 identifies a rate-of-change of the state-of-charge of the battery 212 of the mobile device 102 by monitoring the state-of-charge of the battery 212 over a period of time. Additionally or alternatively, the processor receives the current location from the GPS receiver 206, the target destination from the navigation system 208, and/or the travel time to the target destination from the navigation system 208. For example, the navigation system 208 receives a target destination from the user 104 via the touchscreen 218 and/or another input device and predicts the travel time between the current location of the mobile device 102 and the target destination.

In some examples, the processor 202 of the mobile device 102 emits alerts to the user 104 upon identifying that the mobile device 102 is communicatively decoupled from the vehicle 100 and/or located outside of the cabin 106 of the vehicle 100. For example, when the mobile device 102 and the vehicle 100 are communicatively decoupled, the processor 202 emits a visual alert via the touchscreen 218, an audio alert via the speaker 220, and/or a haptic alert via the haptic motor 222 in response to detecting that the state-of-charge of the mobile device is less than a charge threshold (e.g., 40% of a full charge level). The charge threshold to which the processor 202 compares the state-of-charge may be similar or different than the charge threshold to which the charge controller 130 of the vehicle compares the current and/or a predicted state-of-charge.

Additionally or alternatively, the processor 202 emits audio and/or visual alerts for and/or directions to a nearby publicly-available charging station in response to determining that the state-of-charge of the battery 212 is less than the charge threshold. For example, in response to the processor 202 detecting that the current state-of-charge is less than the charge threshold, the processor 202 retrieves, via the communication module 216, location(s) of one or more publicly-available charging stations that are near the current location of the mobile device 102 from an external network. The processor 202 compares the charging station locations to the current location of the mobile device 102 as identified via the GPS receiver 206 and identifies the publicly-available charging station that is open (e.g., determined based on a comparison of available hours of the charging station and a current time) and/or closest to the current location of the mobile device 102. Further, the navigation system 208 provides directions to the closest publicly-available charging station for the user 104 to facilitate recharging of the battery 212 of the mobile device 102.

Further, in some examples, the processor 202 of the mobile device 102 causes the mobile device 102 to turn off and/or instructs the user 104 to turn off the mobile device 102 in response to determining that the current state-of-charge is less than another charge threshold (e.g., a critical threshold such as 10% of a full charge level). The processor 202 temporarily deactivates the mobile device 102 to enable the user 104 to reactivate the mobile device 102 as the user 104 returns to the vehicle 100 to enable the mobile device 102 to be utilized for passive entry, passive start, and/or remote park-assist for a short period of time. For example, the processor 202 may automatically launch an application utilized to execute commands for passive entry, passive start, and/or remote park-assist.

The processor 202 also may instruct the user 104 on which applications of the mobile device 102 consume large amounts of battery current and/or are actively consuming a large percentage of the remaining state-of-charge. Such instructions provided by the processor 202 (e.g., via the touchscreen 218 and/or the speaker 220) may advise the user 104 to suspend use of one or more of these applications to enable the battery 212 of the mobile device 102 to retain a predetermined amount of current for utilization for passive entry, passive start, and/or remote park-assist.

Figure 3:
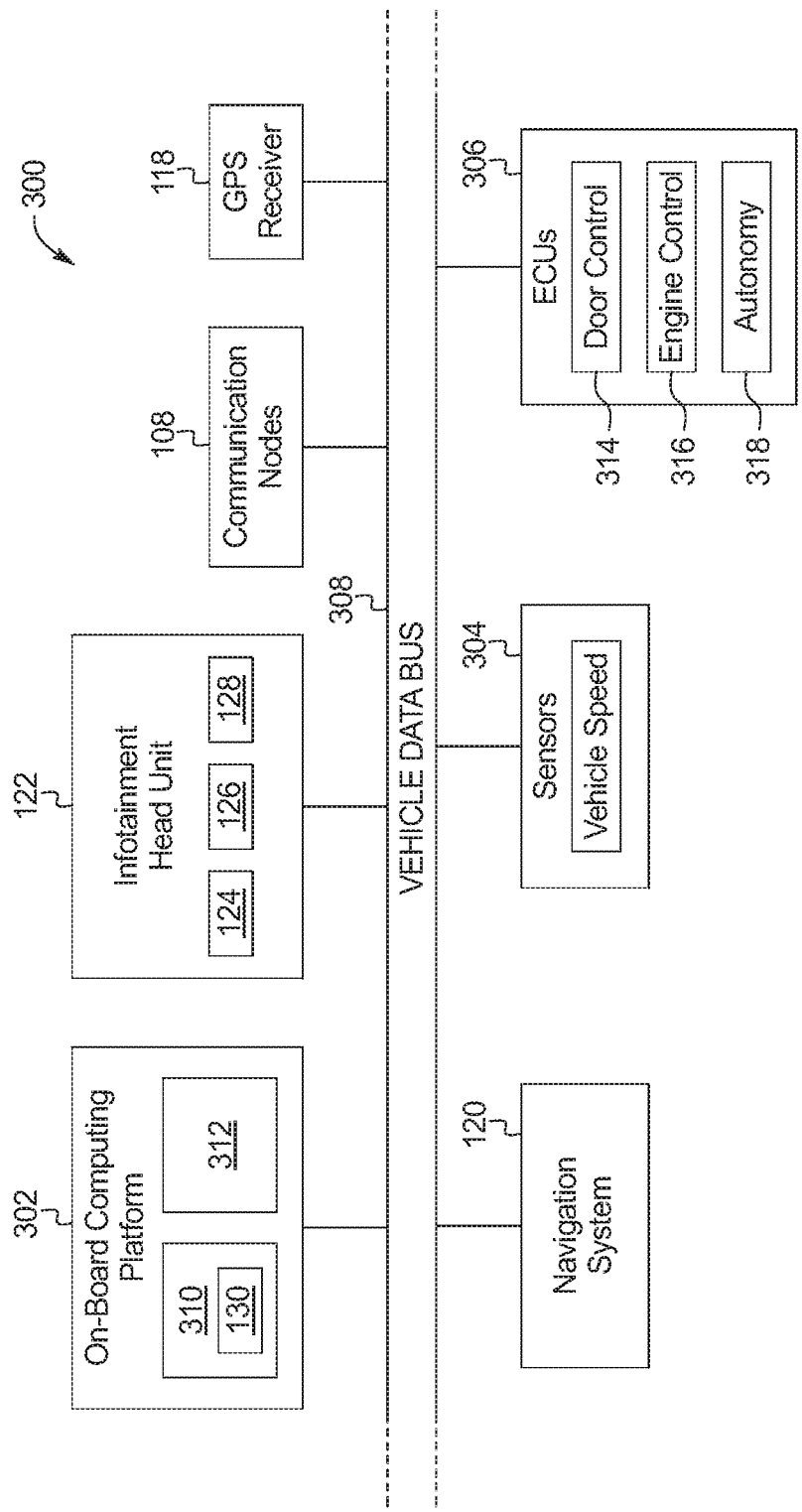
FIG. 3 is a block diagram of electronic components of the vehicle of FIGS. 1A-1B.

FIG. 3 is a block diagram of electronic components 300 of the vehicle 100. As illustrated in FIG. 3, the electronic components 300 include an on-board computing platform 302, the infotainment head unit 122, the communication nodes 108, the GPS receiver 118, the navigation system 120, sensors 304, electronic control units (ECUs) 306, and a vehicle data bus 308.

The on-board computing platform 302 includes a microcontroller unit, controller or processor 310 and memory 312. In some examples, the processor 310 of the on-board computing platform 302 is structured to include charge controller 130. Alternatively, in some examples, the charge controller 130 is incorporated into another electronic control unit (ECU) with its own processor 310 and memory 312. The processor 310 may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs). The memory 312 may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc). In some examples, the memory 312 includes multiple kinds of memory, particularly volatile memory and non-volatile memory.

The memory 312 is computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory 312, the computer readable medium, and/or within the processor 310 during execution of the instructions.

The sensors 304 are arranged in and around the vehicle 100 to monitor properties of the vehicle 100 and/or an environment in which the vehicle 100 is located. One or more of the sensors 304 may be mounted to measure properties around an exterior of the vehicle 100. Additionally or alternatively, one or more of the sensors 304 may be mounted inside a cabin of the vehicle 100 or in a body of the vehicle 100 (e.g., an engine compartment, wheel wells, etc.) to measure properties in an interior of the vehicle 100. For example, the sensors 304 include accelerometers, odometers, tachometers, pitch and yaw sensors, wheel speed sensors, microphones, tire pressure sensors, biometric sensors and/or sensors of any other suitable type. In the illustrated example, the sensors 304 include the vehicle speed sensor 116 that measures a speed at which the vehicle 100 is traveling.

The ECUs 306 monitor and control the subsystems of the vehicle 100. For example, the ECUs 306 are discrete sets of electronics that include their own circuit(s) (e.g., integrated circuits, microprocessors, memory, storage, etc.) and firmware, sensors, actuators, and/or mounting hardware. The ECUs 306 communicate and exchange information via a vehicle data bus (e.g., the vehicle data bus 308). Additionally, the ECUs 306 may communicate properties (e.g., status of the ECUs 306, sensor readings, control state, error and diagnostic codes, etc.) to and/or receive requests from each other. For example, the vehicle 100 may have seventy or more of the ECUs 306 that are positioned in various locations around the vehicle 100 and are communicatively coupled by the vehicle data bus 308.

In the illustrated example, the ECUs 306 include a door control unit 314, an engine control unit 316, and an autonomy unit 318. For example, the door control unit 614 controls operation of components and/or systems of a door (e.g., passive entry) of the vehicle 100. The engine control unit 316 control(s) operation (e.g., passive start) of an engine of the vehicle 100. Further, the autonomy unit 318 controls performance of autonomous and/or semi-autonomous driving maneuvers (e.g., remote park-assist) of the vehicle 100.

The vehicle data bus 308 communicatively couples the communication nodes 108, the GPS receiver 118, the navigation system 120, the infotainment head unit 122, the on-board computing platform 302, the sensors 304, and the ECUs 306. In some examples, the vehicle data bus 308 includes one or more data buses. The vehicle data bus 308 may be implemented in accordance with a controller area network (CAN) bus protocol as defined by International Standards Organization (ISO) 11898-1, a Media Oriented Systems Transport (MOST) bus protocol, a CAN flexible data (CAN-FD) bus protocol (ISO 11898-7) and/a K-line bus protocol (ISO 9141 and ISO 14230-1), and/or an Ethernet™ bus protocol IEEE 802.3 (2002 onwards), etc.

Figure 4:
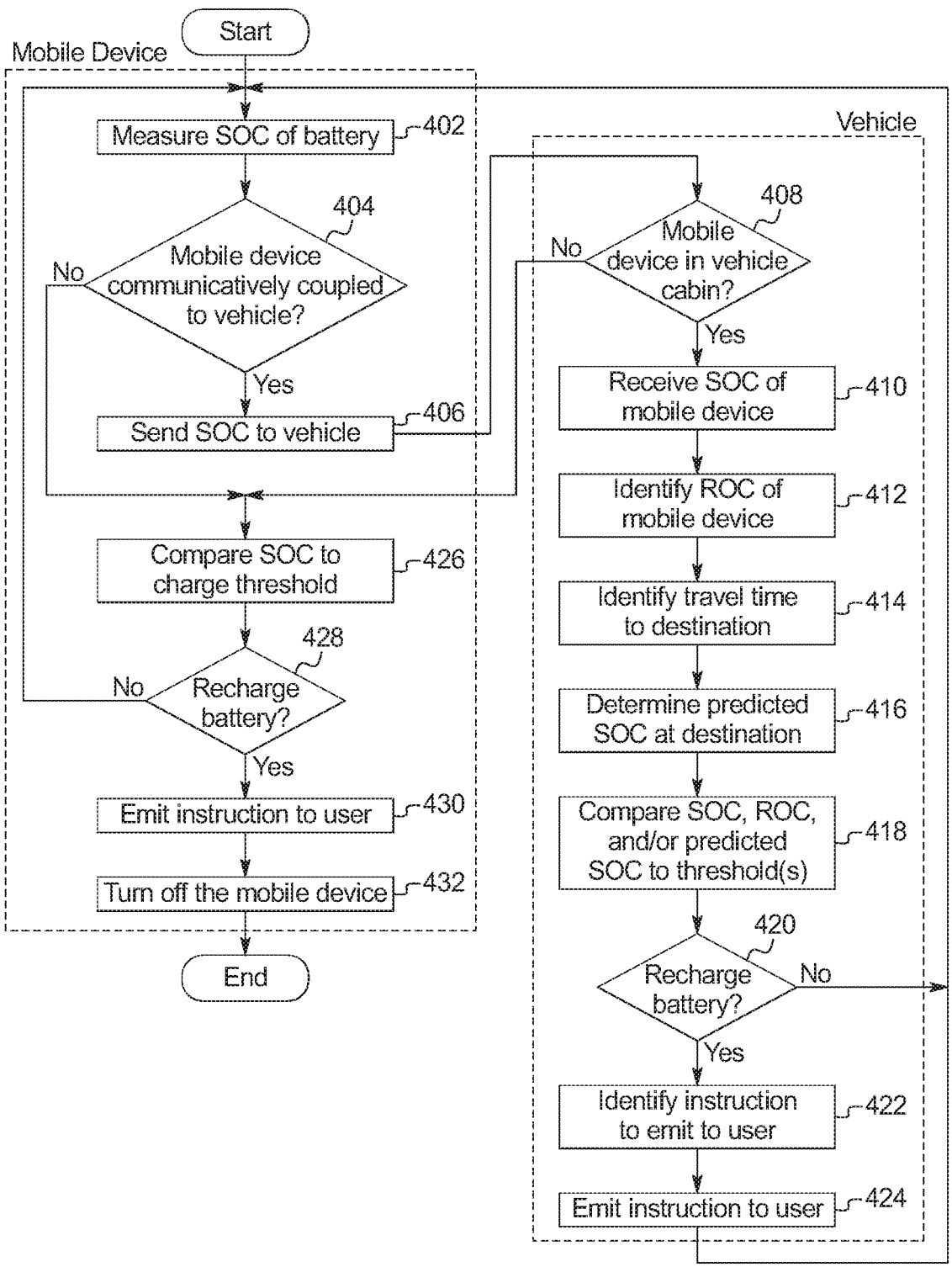
FIG. 4 is a flowchart for monitoring a state-of-charge of a mobile device communicatively coupled to a vehicle in accordance with the teachings herein.

FIG. 4 is a flowchart of an example method 400 to monitor a state-of-charge of a mobile device communicatively coupled to a vehicle. The flowchart of FIG. 4 is representative of machine readable instructions that are stored in memory (such as the memory 312 of FIG. 3) and include one or more programs which, when executed by a processor (such as the processor 202 of FIG. 2 and/or the processor 310 of FIG. 3), cause the vehicle 100 to implement the example charge controller 130 of FIGS. 1A-1B and 3. While the example program is described with reference to the flowchart illustrated in FIG. 4, many other methods of implementing the example charge controller 130 may alternatively be used. For example, the order of execution of the blocks may be rearranged, changed, eliminated, and/or combined to perform the method 400. Further, because the method 400 is disclosed in connection with the components of FIGS. 1A-3, some functions of those components will not be described in detail below.

Initially, at block 402, the battery sensor 210 of the mobile device 102 measures a state-of-charge of the battery 212 of the mobile device 102. At block 404, the processor 202 of the mobile device 102 determines whether the communication module 214 is communicatively coupled to one or more of the communication nodes 108 of the vehicle 100. In response to the processor 202 determining that the mobile device 102 is not communicatively coupled to the vehicle 100, the method 400 proceeds to block 426. Otherwise, in response to the processor 202 determining that the mobile device 102 is communicatively coupled to the vehicle 100, the method 400 proceeds to block 406 at which the communication module 214 of the mobile device 102 sends the current state-of-charge of the mobile device 102 to the vehicle 100 via one or more of the communication nodes 108.

At block 408, the charge controller 130 of the vehicle 100 determines whether the mobile device 102 is located within the cabin 106 of the vehicle 100. For example, the charge controller 130 determines whether the mobile device 102 is located within the cabin 106 via received signal strength indicators, GPS, time-of-flight, angle-of-arrival, etc. In other examples, the processor 202 of the mobile device 102 determines that the mobile device 102 is outside of the vehicle 100 via a GPS location of the mobile device 102 and a GPS location of the vehicle 100. In response to the charge controller 130 determining that the mobile device is not within the cabin 106 of the vehicle 100, the method 400 proceeds to block 426. For example, the charge controller 130 sends, via one or more of the communication nodes 108, a signal to the mobile device 102 that indicates the mobile device 102 is outside of the vehicle 100. Otherwise, in response to the charge controller 130 determining that the mobile device is within the cabin 106 of the vehicle 100, the method 400 proceeds to block 410.

At block 410, the charge controller 130 receives the state-of-charge of the battery 212 of the mobile device 102 via one or more of the communication nodes 108 of the vehicle 100. At block 412, the charge controller 130 identifies a rate-of-change of the state-of-charge of the battery 212 of the mobile device 102. In some examples, the charge controller 130 determines the rate-of-change by comparing measured state-of-charge values of the battery 212 over a period of time. In other examples, the charge controller 130 receives the rate-of-change from the mobile device 102. At block 414, the charge controller 130 determines a travel time to a destination of the vehicle 100. For example, the charge controller 130 receives the travel time that is determined by the navigation system 120 of the vehicle 100 and/or the navigation system 208 of the mobile device 102 that determines the travel time based upon a current location of the vehicle 100 and/or the mobile device 102 and a target destination provided by the user 104. At block 416, the charge controller 130 determines a predicted state-of-charge of the battery 212 of the mobile device 102 for when the vehicle 100 arrives at the target destination based upon, the current state-of-charge, the rate-of-change, and the travel time to the target destination.

At block 418, the charge controller 130 compares the predicted state-of-charge, the current state-of-charge, and the rate-of-change to threshold(s). At block 420, the charge controller 130 determines whether the mobile device 102 should be coupled to the charging station 114 of the vehicle 100 for recharging of the battery 212 based upon the comparison(s) performed at block 418. For example, the charge controller 130 determines that the battery 212 is to be recharged in response to determining that the predicted state-of-charge is less than a first threshold (e.g., a charge threshold), the current state-of-charge is less than a second threshold (e.g., a charge threshold), and/or the rate-of-change is greater than a third threshold (e.g., a rate threshold). In response to the charge controller 130 determining that the battery 212 of the mobile device 102 is not in a state for recharging, the method 400 returns to block 402. Otherwise, in response to the charge controller 130 determining that the battery 212 of the mobile device 102 is in a state for recharging, the method 400 proceeds to block 422 at which the charge controller 130 determines an instruction to emit to the user 104. At block 424, the charge controller 130 emits (e.g., via the mobile device 102 and/or the infotainment head unit 122) the instruction for the user 104 to recharge the mobile device 102.

Returning to block 426, the processor 202 of the mobile device 102 compares the current state-of-charge of the battery 212 to charge threshold(s) upon identifying that the mobile device 102 is decoupled from the vehicle 100 (block 404) and/or is outside of the cabin 106 of the vehicle 100 (block 408). At block 428, the processor 202 determines whether the mobile device 102 should be coupled to a charging station for recharging of the battery 212 based upon the comparison(s) performed at block 426. For example, the processor 202 determines that the battery 212 is to be recharged in response to determining that the current state-of-charge is less than a charge threshold. In response to the processor 202 determining that the battery 212 of the mobile device 102 is not in a state for recharging, the method 400 returns to block 402. Otherwise, in response to the charge controller 130 determining that the battery 212 of the mobile device 102 is in a state for recharging, the method 400 proceeds to block 430 at which the mobile device 102 emits an instruction to the user 104 to recharge the battery 212 of the mobile device 102. For example, the processor 202 emits an audio alert via the speaker 220, a visual alert via the touchscreen 218, and/or a haptic alert via the haptic motor 222 in response to determining that the current state-of-charge is less than a charge threshold. Additionally or alternatively, the processor 202 emits audio and/or visual alerts for and/or directions to a nearby publicly-available charging station in response to determining that the current state-of-charge is less than the charge threshold. At block 432, the processor 202 causes the mobile device 102 to turn off and/or instructs the user 104 to turn off the mobile device 102 in response to determining that the current state-of-charge is less than another charge threshold.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively. Additionally, as used herein, the terms "module," "unit," and "node" refer to hardware with circuitry to provide communication, control and/or monitoring capabilities, often in conjunction with sensors. A "module," a "unit," and a "node" may also include firmware that executes on the circuitry.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A system comprising:
    a mobile device including:
        a sensor to measure a state of charge (SOC);
        a communication module to send the SOC; and
        a processor; and
    a vehicle including:
        a communication node to receive the SOC;
        a charging station; and
        a controller to:
            determine a predicted SOC based on the SOC, a rate-of-change, and a travel time to a destination; and
            instruct to utilize the charging station when the predicted SOC is less than a threshold,
    wherein the processor of the mobile device is configured to:
        identify when the mobile device is communicatively decoupled from the vehicle, and
        when the mobile device and the vehicle are communicatively decoupled, emit at least one of an audio alert, a visual alert, and a haptic alert in response to determining that the SOC is less than a second threshold,
    wherein, when the mobile device and the vehicle are communicatively decoupled, the processor is configured to:
        identify, in response to determining that the SOC is less than the second threshold, an open public charging station from an external network; and
        provide directions to the open public charging station.

2. The system of claim 1, wherein the mobile device further includes a navigation system that receives the destination from a user and determines the travel time between the destination and a current location.

3. The system of claim 1, wherein, when the mobile device and the vehicle are communicatively decoupled, the processor turns off the mobile device in response to determining that the SOC is less than a third threshold.

4. A system comprising:
    a mobile device including:
        a sensor to measure a state of charge (SOC);
        a communication module to send the SOC; and
        a processor; and
    a vehicle including:
        a communication node to receive the SOC;
        a charging station; and
        a controller to:
            determine a predicted SOC based on the SOC, a rate-of-change, and a travel time to a destination; and
            instruct to utilize the charging station when the predicted SOC is less than a threshold,
    wherein the processor of the mobile device is configured to:
        identify when the mobile device is communicatively decoupled from the vehicle, and
        when the mobile device and the vehicle are communicatively decoupled, emit at least one of an audio alert, a visual alert, and a haptic alert in response to determining that the SOC is less than a second threshold,
    wherein, when the mobile device and the vehicle are communicatively decoupled, the processor turns off the mobile device in response to determining that the SOC is less than a third threshold.

* * * * *